(12) United States Patent
Barth, Jr. et al.

(10) Patent No.: US 8,125,840 B2
(45) Date of Patent: Feb. 28, 2012

(54) REFERENCE LEVEL GENERATION WITH OFFSET COMPENSATION FOR SENSE AMPLIFIER

(75) Inventors: John E. Barth, Jr., Essex Junction, VT (US); Erik A. Nelson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 12/550,848

(22) Filed: Aug. 31, 2009

(65) Prior Publication Data

US 2011/0051532 A1    Mar. 3, 2011

(51) Int. Cl.
*G11C 5/14* (2006.01)
*G11C 7/00* (2006.01)

(52) U.S. Cl. ............ 365/189.09; 365/203; 365/205

(58) Field of Classification Search .......... None
See application file for complete search history.

(56) References Cited

U.S. PATENT DOCUMENTS

| | | | |
|---|---|---|---|
| 4,107,556 A * | 8/1978 | Stewart et al. | 327/57 |
| 6,181,621 B1 | 1/2001 | Lovett | |
| 6,304,505 B1 * | 10/2001 | Forbes et al. | 365/205 |
| 6,373,771 B1 | 4/2002 | Fifield et al. | |
| 6,438,051 B1 | 8/2002 | Fifield et al. | |
| 6,674,328 B2 | 1/2004 | Uto et al. | |
| 6,819,600 B2 | 11/2004 | Sim | |
| 7,123,531 B2 | 10/2006 | Rho | |
| 7,164,612 B1 | 1/2007 | Eleyan et al. | |
| 7,221,605 B2 | 5/2007 | Forbes | |
| 7,227,798 B2 | 6/2007 | Gupta et al. | |
| 7,286,416 B2 | 10/2007 | Ooishi et al. | |
| 2005/0237400 A1 | 10/2005 | Blerkom et al. | |
| 2006/0119329 A1 | 6/2006 | Jacobs et al. | |

FOREIGN PATENT DOCUMENTS

EP     0928056 A2     7/1997

OTHER PUBLICATIONS

Kawahara et al., "A High-Speed, Small-Area, Threshold-Voltage-Mismatch Compensation Sense Amplifier for Gigabit-Scale DRAM Arrays", Jul. 1993, pp. 816-823, IEEE Journal of Solid-State Circuits, vol. 28, No. 7.

* cited by examiner

*Primary Examiner* — Hoai V Ho
*Assistant Examiner* — James G Norman
(74) *Attorney, Agent, or Firm* — David A. Cain; Hoffman Warnick LLC (57) ABSTRACT

An approach that provides reference level generation with offset compensation for a sense amplifier is described. In one embodiment, an arbitrary reference level is generated to provide an offset that compensates for device mismatch and voltage threshold of a sense amplifier.

21 Claims, 6 Drawing Sheets

REFERENCE LEVEL GENERATION WITH OFFSET COMPENSATION FOR SENSE AMPLIFIER

BACKGROUND

The present invention relates generally to memory sense amplifiers, and more specifically to reference level generation with offset compensation for a sense amplifier.

Contemporary memory access circuits rely on differential sense amplifiers to read small signals generated by a selected memory cell from a memory device such as a dynamic random access memory (DRAM) device. These sense amplifiers typically use transistors configured in a cross-coupled fashion to amplify a small voltage differential created by the cell. This cross-coupled configuration of the transistors is used to tolerate global variation in device threshold by relying on device matching of the transistors as opposed to the absolute threshold voltages of the transistors. As semiconductor device technology continues to evolve towards providing smaller device sizes and more devices per integrated circuit (IC) (and thus smaller voltages utilized within the circuits within the IC), there is an increase in local device mismatch caused by random variation, including random dopant fluctuation and line edge roughness. Consequently, the increase in device mismatch requires more of a signal from the memory cell to reliably overcome the device mismatch, resulting in larger and slower memories.

SUMMARY

In one embodiment, there is a circuit that comprises a first inverter device having an input node and an output node and a second inverter device having an input node and an output node. A gated shunt device is configured to connect and disconnect the input node of the first inverter device to the output node of the first inverter device and the input node of the second inverter device to the output node of the second inverter device. A cross-coupling switch is configured to enable and disable a connection of the input node of the first inverter device to the output node of the second inverter device and the input node of the second inverter device to the output node of the first inverter device. The first inverter device, second inverter device, gated shunt device and cross-coupling switch are operatively coupled to perform one of a pre-charge time operation and sense time operation on a bit line having a bit line true and bit line complement connected to a storage cell from a memory device.

In a second embodiment, there is a sense amplifier that comprises a first inverter device having an input node and an output node and a second inverter device having an input node and an output node. A gated shunt device is configured to connect and disconnect the input node of the first inverter device to the output node of the first inverter device and the input node of the second inverter device to the output node of the second inverter device. A cross-coupling switch is configured to enable and disable a connection of the input node of the first inverter device to the output node of the second inverter device and the input node of the second inverter device to the output node of the first inverter device. The first inverter device, second inverter device, gated shunt device and cross-coupling switch are operatively coupled to perform one of a pre-charge time operation and sense time operation on a bit line having a bit line true and bit line complement connected to a storage cell from a dynamic random access memory (DRAM) array of storage cells. During the pre-charge time operation the gated shunt device is gated on and the cross-coupling switch is disabled, while the gated shunt device is gated off and the cross-coupling switch is enabled during the sense time operation.

In a third embodiment, there is a method for sensing voltage on a bit line having a bit line true and bit line complement connected to a storage cell from a memory device. In this embodiment, the method comprises pre-charging the bit line true and bit line complement; generating an arbitrary mid-level voltage reference to charge the bit line true and bit line complement while simultaneously generating an offset for the bit line true and bit line complement; activating a word line in the storage cell to connect to the bit line in response to generating the arbitrary mid-level voltage reference and the offset; developing a differential signal on the bit line true and bit line complement in response to the storage cell connecting to the bit line; and amplifying the differential signal.

DETAILED DESCRIPTION

Figure 1:
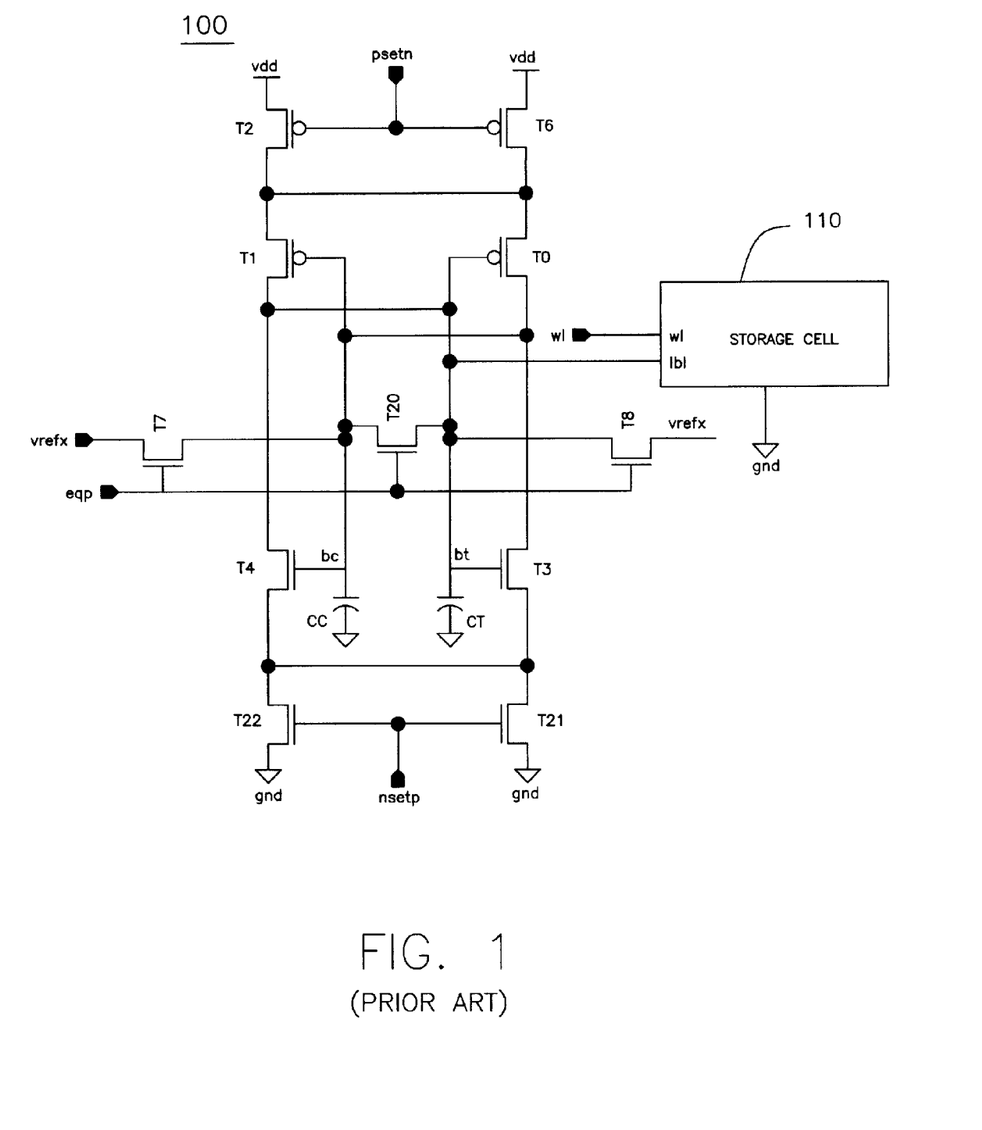
FIG. 1 shows a conventional sense amplifier.

Referring to FIG. 1, there is a schematic circuit diagram of a conventional sense amplifier 100 that is in a cross-coupled configuration. In FIG. 1, a P-type field effect transistor (PFET) T1 and an N-type field effect transistor (NFET) T4 form one gated inverter, while a PFET T0 and an NFET (T3) form another gated inverter (hereinafter referred to as "inverter(s)"). The inverters connect to a storage cell 110 from a dynamic random access memory (DRAM) array of storage cells. Typically, a DRAM array may contain hundreds or thousands of storage cells, where each cell includes a capacitor for storing a voltage value that represents a logical binary "0" or "1" value and a transistor that switches the voltage value of the storage cell onto a bit line signal line. As shown in FIG. 1, the inverters connect to the storage cell via a bit line lbl that includes a pair of bit lines that provide the "true" and "complement" states of the logical binary value stored in storage cell 110 that are selected for reading or writing. Bit line true and bit line complement are represented in FIG. 1 by signal line bt and signal line bc. Note that in a typical DRAM array, there are an equal number of storage cells coupled to bit line bt and bit be to balance parasitic capacitances, however, for ease of illustration and explanation, only one cell is illustrated in FIGS. 1 and 4. As shown in FIG. 1, bit line bt is inputted into the inverter formed by PFET T0 and NFET T3, and bit line be is inputted into the inverter formed by PFET T1 and NFET T4. Both bit line bt and bit line be connect to ground via a capacitor, capacitor true CT and capacitor complement CC, respectively. Capacitor true CT and capacitor complement CC represent the parasitic capacitance of the wiring and cells coupled to the bit line bt and bit line bc, respectively.

The inverters formed by PFET T0 and NFET T3, and PFET T1 and NFET T4 are cross-coupled because the output of one inverter is coupled to the input of the other inverter, while the output of the other inverter is coupled to the input of the first inverter. In FIG. 1, the inverter formed by PFET T0 and NFET T3 has its output coupled to the input of the inverter formed by PFET T1 and NFET T4 along the bc line, while the inverter formed by PFET T1 and NFET T4 has its output coupled to the input of the inverter formed by PFET T0 and NFET T3 along the bt line.

Before the inverters formed by PFET T0 and NFET T3, and PFET T1 and NFET T4, can receive data from storage cell 110 along bit line lbl, the bit lines bt and bc are pre-charged or pre-conditioned to a "ready" state after initially being in a "stand-by" state waiting for a command. In FIG. 1, a pre-charger formed by NFET T7, NFET T20 and NFET T8 receives a voltage reference vrefx as controlled by an equalize phase signal eqp. In one embodiment, when the eqp signal is "high", then NFET T7, NFET T20 and NFET T8 are set to voltage reference vrefx, which in turn is provided to bit lines bt and bc. After the bit lines bt and bc have been pre-charged to the voltage reference vrefx, then the bit lines will be released from the voltage reference when the eqp signal turns "low".

When the bit lines bt and bc are released from the state of pre-charging to the voltage reference vrefx, then the inverters formed by PFET T0 and NFET T3 and PFET T1, and NFET T4 are connected to storage cell 110 along bit line lbl and a signal is applied. In particular, a word line wl in storage cell 110 is activated and bit line lbl connects to the cell through one of the bt bit line or bc bit line. Once connected there is a charge-sharing that occurs with the storage cell 110 and one of the bt bit line or bc bit line via capacitors CT and CC, respectively. A result of this charge sharing is that the charge in the storage cell and the charge in one of the bt bit line or bc bit line will change, leaving a voltage differential with the other bit line not taking part in the charge sharing.

It is this voltage differential that sense amplifier 100 will amplify. In particular, a pair of set devices is used to amplify the voltage differential formed between bt bit line and bc bit line. As shown in FIG. 1, one set device is a psetn device formed by PFET T2 and PFET T6 and the second set device is an nsetp device formed by NFET T21 and NFET T22. The psetn device formed by PFET T2 and PFET T6 which is coupled at their gates is coupled to power supply Vdd, while the nsetp device formed by NFET T21 and NFET T22 is also coupled at their gates and is coupled to ground. Enabling the psetn device and the nsetp device causes the inverters formed by PFET T0 and NFET T3, and PFET T1 and NFET T4 to amplify bt bit line and bc bit line.

Figure 2:
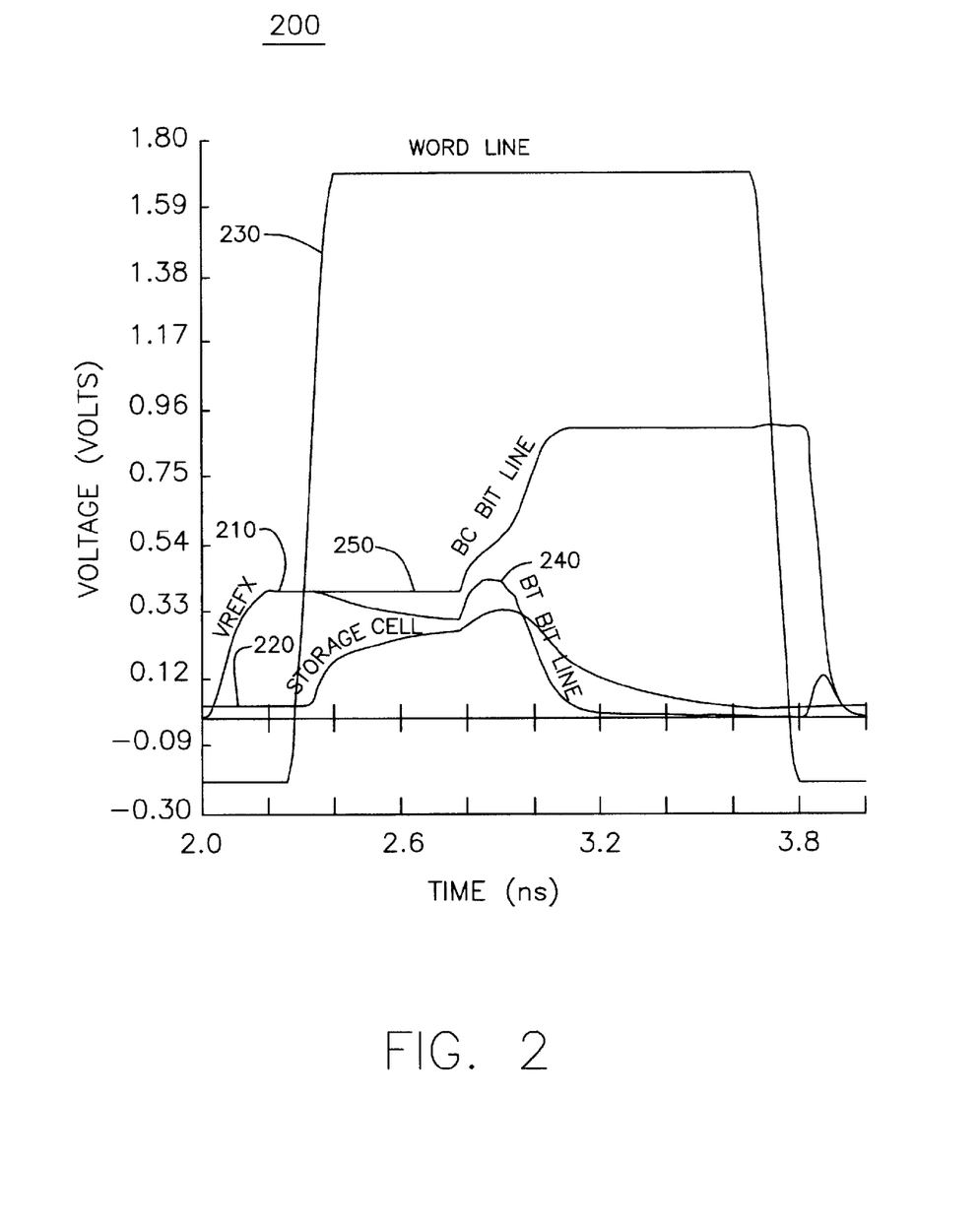
FIG. 2 shows a simulation of the operation of the conventional sense amplifier shown in FIG. 1.

FIG. 2 shows a simulation 200 of the operation of the conventional sense amplifier 100 shown in FIG. 1. In simulation 200, line 210 represents the pre-charge time operation of bt bit line and bc bit line by voltage reference vrefx, line 220 represents the voltage that is stored in storage cell 110 and line 230 represents the word line wl in the cell. As shown in FIG. 2, once the word line wl is activated (goes "high" at around 160 mV) charge sharing takes place between bt bit line and bc bit line. In this simulation, there is a charge sharing between bt bit line 240 and the voltage of the storage cell as represented by line 220. In particular, simulation 200 shows that the voltage of bt bit line decreases while the charge of the storage cell 220 increases. Because there is no charge sharing with bc bit line, its voltage level remains the same. As a result, there is a voltage differential between bt bit line and bc bit line. At around time 2.8 nanoseconds (ns) the set devices (nsetp and psetn) are turned on to amplify the voltage differential between bt bit line and bc bit line. Consequently, the voltages of bt bit line and bc bit line are moved in the direction that further illustrates the amplification of this voltage differential.

Figure 3:
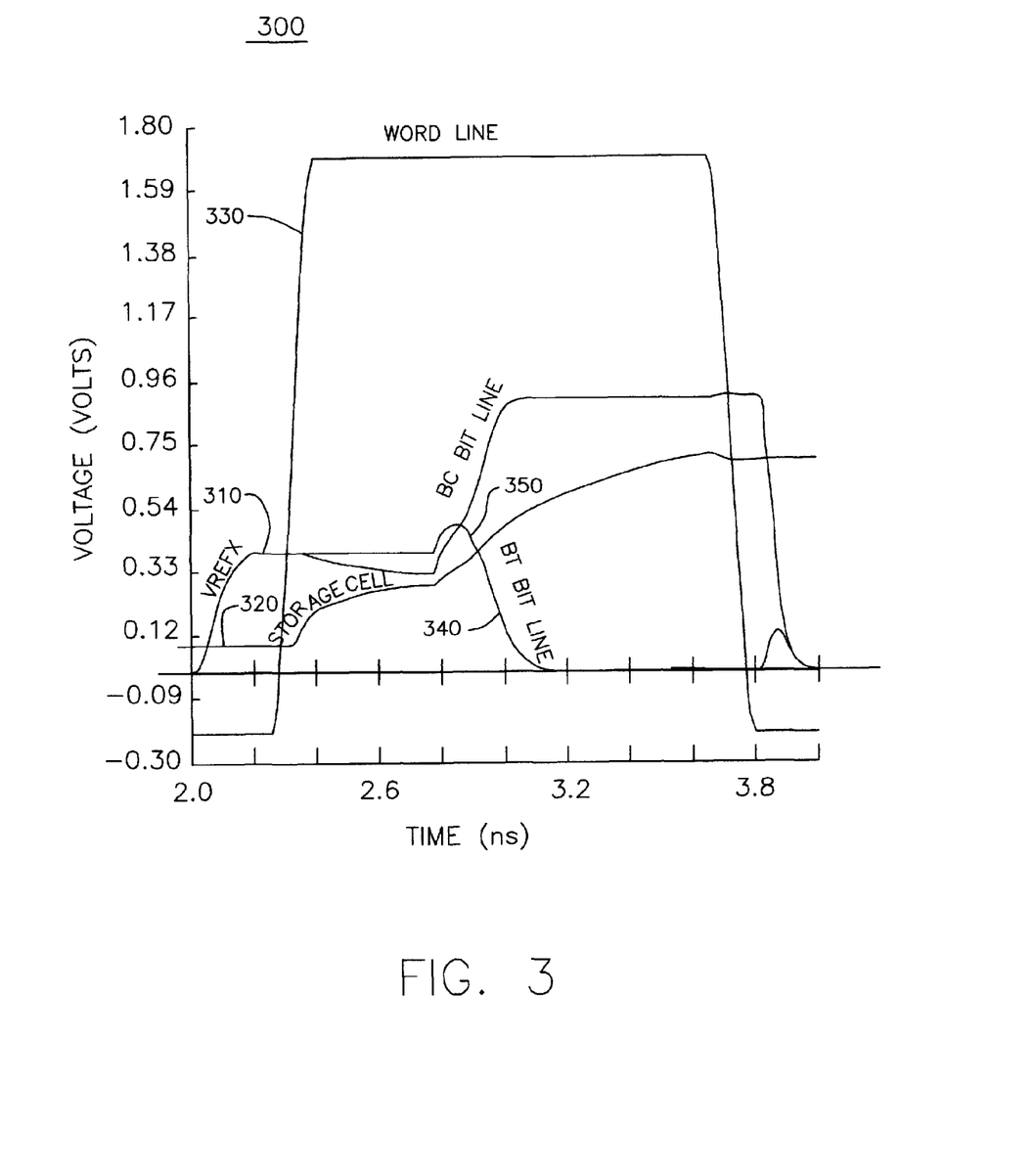
FIG. 3 shows a simulation of the operation of the conventional sense amplifier shown in FIG. 1 when presented with device and voltage threshold mismatch.

As mentioned above, local device mismatch caused by random variation, including random dopant fluctuation and line edge roughness has become an ever increasing problem as semiconductor device technology continues to evolve towards providing smaller device sizes and more devices per integrated circuit (IC). FIG. 3 shows a simulation 300 of the operation of a conventional sense amplifier like the one shown in FIG. 1 when presented with device and voltage threshold mismatch. Like simulation 200 shown in FIG. 2, simulation 300 uses like reference elements to represent like elements except in FIG. 3 the like elements are preceded by a "3" as opposed to a "2". As shown in FIG. 3, once the word line wl is activated charge sharing takes place between bt bit line and bc bit line. Like FIG. 2, there is a charge sharing between bt bit line 340 and the voltage of the storage cell as represented by line 320. Because there is no charge sharing with bc bit line 350, its voltage level remains the same. As a result, there is a voltage differential between bt bit line 340 and bc bit line 350. The set devices (nsetp and psetn) are turned at around time 2.8 ns to amplify the voltage differential between bt bit line and bc bit line. But, because the device and voltage threshold mismatch is more prominent in this example, voltage lines for bt bit line 340 and bc bit line 350 move in opposite directions causing their paths to cross instead of diverge. The crossing of paths represent that the inverters have chosen the wrong states and this is an indication that the sense amplifier is not operating properly.

Figure 4:
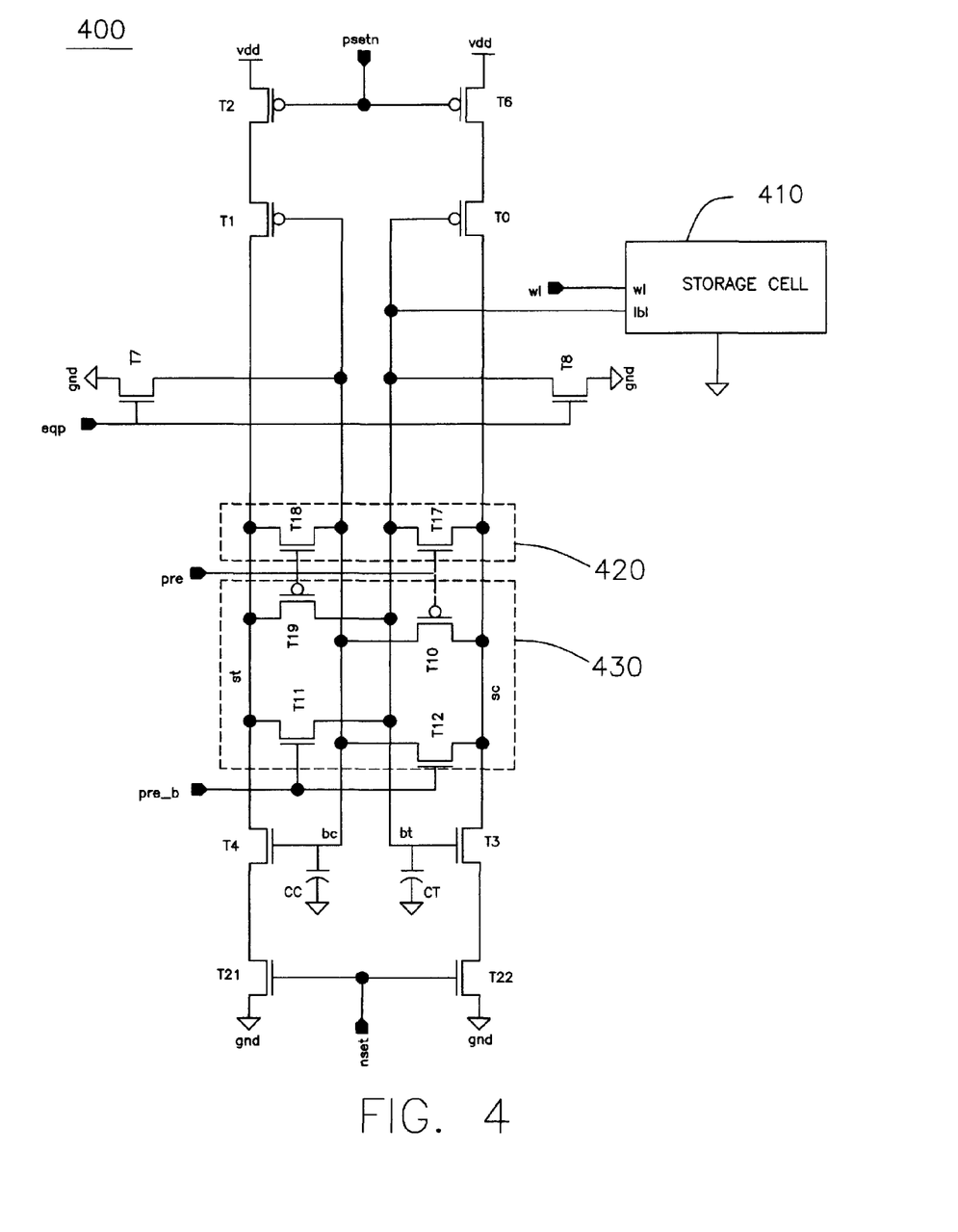
FIG. 4 shows a circuit of a sense amplifier according to one embodiment of the present invention.

Embodiments of the present invention have addressed this problem associated with local device mismatch caused by random variation by establishing a reference level which adjusts for device and voltage threshold mismatch. FIG. 4 shows a circuit 400 of a sense amplifier according to one embodiment of the present invention. In FIG. 4, PFET T1 and NFET T4 form one inverter, while PFET T0 and NFET T3 form another inverter. The inverters connect to a storage cell 410 from a DRAM array of storage cells. Although the description that follows is directed to using the sense amplifier of FIG. 4 with a DRAM array, those skilled in the art will recognize that embodiments of the sense amplifier are also suited for use with other memory devices such as for example a static RAM (SRAM) device.

As shown in FIG. 4, the inverters connect to the storage cell via a bit line lbl that includes a pair of bit lines, bit line true bt and bit line complement bc. As shown in FIG. 4, bit line bt is inputted into the inverter formed by PFET T0 and NFET T3, and bit line bc is inputted into the inverter formed by PFET T1 and NFET T4. Both bit line bt and bit line bc connect to ground via a capacitor, capacitor true CT and capacitor complement CC, respectively. Capacitor true CT and capacitor complement CC represent the parasitic capacitance of the wiring and cells coupled to the bit line bt and bit line bc, respectively. Note that these capacitances are placed on the inputs to the inverters formed by PFET T0 and NFET T3, and PFET T1 and NFET T4, to hold the offset compensation values on the inputs of the inverters. If the capacitances were placed on the outputs from the inverters formed by PFET T0 and NFET T3, and PFET T1 and NFET T4, then this configuration would render sense amplifier 400 more sensitive to offset than the circuit shown in the prior art of FIG. 1.

A gated shunt device 420 formed from NFET T17 and NFET T18 is configured to connect the input node of the inverter device formed from PFET T0 and NFET T3 to its output and similarly to connect the input node of the inverter device formed from PFET T1 and NFET T4 to its output. In particular, FIG. 4 shows that NFET T17 connects the input node bt of inverter PFET T0 and NFET T3 to its output node sc, and that NFET T18 connects the input node bc of inverter PFET T1 and NFET T4 to its output node st.

FIG. 4 shows that the sense amplifier 400 further includes a cross-coupling switch 430 that is configured to enable and disable a connection of the input node of the inverter device formed by PFET T0 and NFET T3 to the output node of the inverter device formed by PFET T1 and NFET T4 and the input node of the inverter device formed by PFET T1 and NFET T4 to the output node of the inverter device formed by PFET T0 and NFET T3. In one embodiment as shown in FIG. 4, the cross-coupling switch 430 comprises a first NFET/PFET transmission gate formed from PFET T19 and NFET T11 and a second NFET/PFET transmission gate formed from PFET T10 and NFET T12. In this embodiment, the NFET/PFET transmission gate formed from PFET T19 and NFET T11 and the NFET/PFET transmission gate formed from PFET T10 and NFET T12 each has complementary enable and disable signals to enable and disable the cross-coupling of the inverters. As shown in FIG. 4, the transmission gate formed from PFET T19 and NFET T11 couples the output st from the inverter formed by PFET T1 and NFET T4 to the input bt of the inverter formed by PFET T0 and NFET T3. Similarly, the transmission gate formed from PFET T10 and NFET T12 couples the output sc from the inverter formed by PFET T0 and NFET T3 to the input bc of the inverter formed by PFET T1 and NFET T4.

Note that the cross-coupling switch 430 formed from PFET T19 and NFET T11 and PFET T10 and NFET T12 are configured to ensure that the parasitic capacitances represented by capacitor true CT and capacitor complement CC are placed on the inputs to the inverters formed by PFET T0 and NFET T3, and PFET T1 and NFET T4, to hold the offset compensation values on the inputs of the inverters. If the capacitances were placed on the outputs from the inverters formed by PFET T0 and NFET T3, and PFET T1 and NFET T4, then enabling the cross-coupling switch 430 would result in the offset compensation values being placed on the wrong input and lead to a negative compensation.

FIG. 4 further shows that the sense amplifier 400 includes a pair of set devices that as explained below are used during various phases of operation of the amplifier. One set device is a psetn device formed by PFET T2 and PFET T6 and the second set device is an nset device formed by NFET T21 and NFET T22. The psetn device formed by PFET T2 and PFET T6, which is coupled at their gates, is coupled to power supply Vdd; while the nset device formed by NFET T21 and NFET T22 is also coupled at their gates and is coupled to ground gnd.

The sense amplifier 400 of FIG. 4 further includes a precharger that as explained below is used during stand-by and pre-charge phases of operation of the amplifier. The precharger in FIG. 4 is formed from NFET T7 and NFET T8 and is controlled by an equalize phase signal eqp. One node of NFET T7 is coupled to bit line bc, while its other node goes to ground. Similarly, NFET T8 is coupled to bit line bt, while its other node goes to ground.

In operation, sense amplifier 400 is configured to perform four phases of operation. The four phases of operation are referred to herein as the stand-by time operation, pre-charge time operation, signal time operation and amplify time operation. As used herein, a sense time operation collectively describes the signal time operation and the amplify time operation.

In the stand-by state of time operation, bit lines bt and bc are waiting for a command to initiate the pre-charge time operation that puts the bit lines in the ready state. In particular, equalize phase signal eqp is high during the stand-by state, which causes NFET T7 and NFET T8 to turn on and hold bit lines bt and bc at ground. When phase signal eqp goes low, NFET T7 and NFET T8 turn off which causes bit lines bt and bc to float.

The pre-charge time phase of operation that puts the bit lines in the ready state is initiated when the psetn device formed from PFET T2 and PFET T6 and the nset device formed from NFET T21 and NFET T22 are turned on. The psetn device is turned on when the psetn signal is low and nset device is turned on when the nset signal is high. In addition to turning on the psetn device and the nset device during the pre-charge time operation, the gated shunt device 420 formed from NFET T17 and NFET T18 is enabled by the pre signal and the cross-coupling switch 430 formed from PFET T19 and NFET T11 and PFET T10 and NFET T12 is disabled by both the pre signal and pre_b signal.

This causes the connection of the input node of the inverter device formed from PFET T0 and NFET T3 to its output and similarly the connection of the input node of the inverter device formed from PFET T1 and NFET T4 to its output. Essentially, enabling the gated shunt device 420 puts each inverter at its trip point, resulting in the generation of an offset voltage applied to the gates of the inverters. This results in the offset voltage being applied to the bit lines bt and bc. The offset voltage is basically an arbitrary reference level that provides offset for bit lines bt and bc that compensates for any mismatch. The offset voltage compensates for any device mismatch and any voltage threshold mismatch that exists with the inverters of the sense amplifier 400. In one embodiment, the reference level voltage is an arbitrary mid-level voltage reference that has a value that is between Vdd and ground. After the bit lines bt and bc have been pre-charged to the arbitrary reference level provided by the offset voltage, then the bit lines are released from the offset by disabling the psetn device and the nset device, as well as disabling the gated shunt device 420.

When the bit lines bt and bc are released from the state of pre-charging to the offset voltage, then the sense amplifier 400 is ready to perform the sense time operation which includes first the signal time phase of operation and then the amplify time phase of operation. During the sense time operation, the gated shunt device 420 remains gated off and the cross-coupling switch 430 formed from PFET T19 and NFET T11 and PFET T10 and NFET T12 is enabled by both the pre signal and pre_b signal.

During the signal time phase of operation, the inverters formed by PFET T0 and NFET T3, and PFET T1 and NFET T4 are connected to storage cell 410 by activating bit line lbl via cross-coupling switch 430. In particular, a word line wl in storage cell 410 is activated and bit line lbl connects to the cell through one of the bt bit line or bc bit line. Once connected there is a charge-sharing that occurs with the storage cell 410 and one of the bt bit line or bc bit line via capacitors CT and CC, respectively. A result of this charge sharing is that the charge in the storage cell and the charge in one of the bt bit line or bc bit line will change, leaving a voltage differential with the other bit line not taking part in the charge sharing.

It is this voltage differential that sense amplifier 400 will amplify during the amplify time operation. In particular, during the amplify time operation, the cross-coupling switch 430 remains enabled and the psetn device formed by PFET T2 and PFET T6 and the nset device formed by NFET T21 and NFET T22 are turned on by a low psetn signal and a high nset signal to the psetn device and the nset device, respectively. Enabling the psetn device and the nsetp device causes the inverters formed by PFET T0 and NFET T3, and PFET T1 and NFET T4, to amplify bt bit line and bc bit line.

In this embodiment, the use of the gated shunt device 420, the cross-coupling switch 430, psetn device and nset device, pre-charger with the inverters formed by PFET T1 and NFET T4 and PFET T0 and NFET T3 enable the sense amplifier 400 to create a reference level for differential sensing in a way that compensates for random threshold mismatch. In essence, the offset compensation is achieved through a creative use of switches (i.e., gated shunt device 420 and the cross-coupling switch 430) to configure a cross-coupling sense amplifier that perform four phases of operation; the stand-by time phase of operation, pre-charge time phase of operation, signal time phase of operation and amplify time phase of operation. During the pre-charge time phase of operation, an offset compensation is provided by disabling the cross-coupling switch 430 and enabling the gated shunt device 420 along with the psetn device and nset device. This allows the inverters formed by PFET T1 and NFET T4, and PFET T0 and NFET T3, to have outputs shorted to inputs. Thus, when the psetn device and nset device apply a short pulse to the inverter pairs, each inverter will independently reach a trip point that is dependent on the inverter's specific device thresholds. With the proper connection of the bit line load, such that the offset voltage is maintained on the gate of the inputs of the FETs that created the offset (not the drain), the bit line lbl is also pre-charged to the same potential. This trip point not only provides offset compensation but also provides the mid-level reference required to enable differential sensing of the storage cell 410 while performing the sense time operation which collectively includes signal time phase of operation and the amplify time of operation. With both sides of the inverters that form the sense amplifier pre-charged to their individual trip points, a small shift in bit line potential created by reading the cell can be reliably amplified, even in the presence of significant device mismatch. During both the signal time phase of operation and amplify time phase of operation, the gated shunt device 420 is disabled and the cross-coupling switch 430 is enabled. This allows the sense amplifier 400 to generate a voltage differential signal on the bt bit line and bc bit line during the signal time phase of operation. Then, the psetn device and nset device are enabled which results in the amplification of the voltage differential signal during the amplify time operation.

Figure 5:
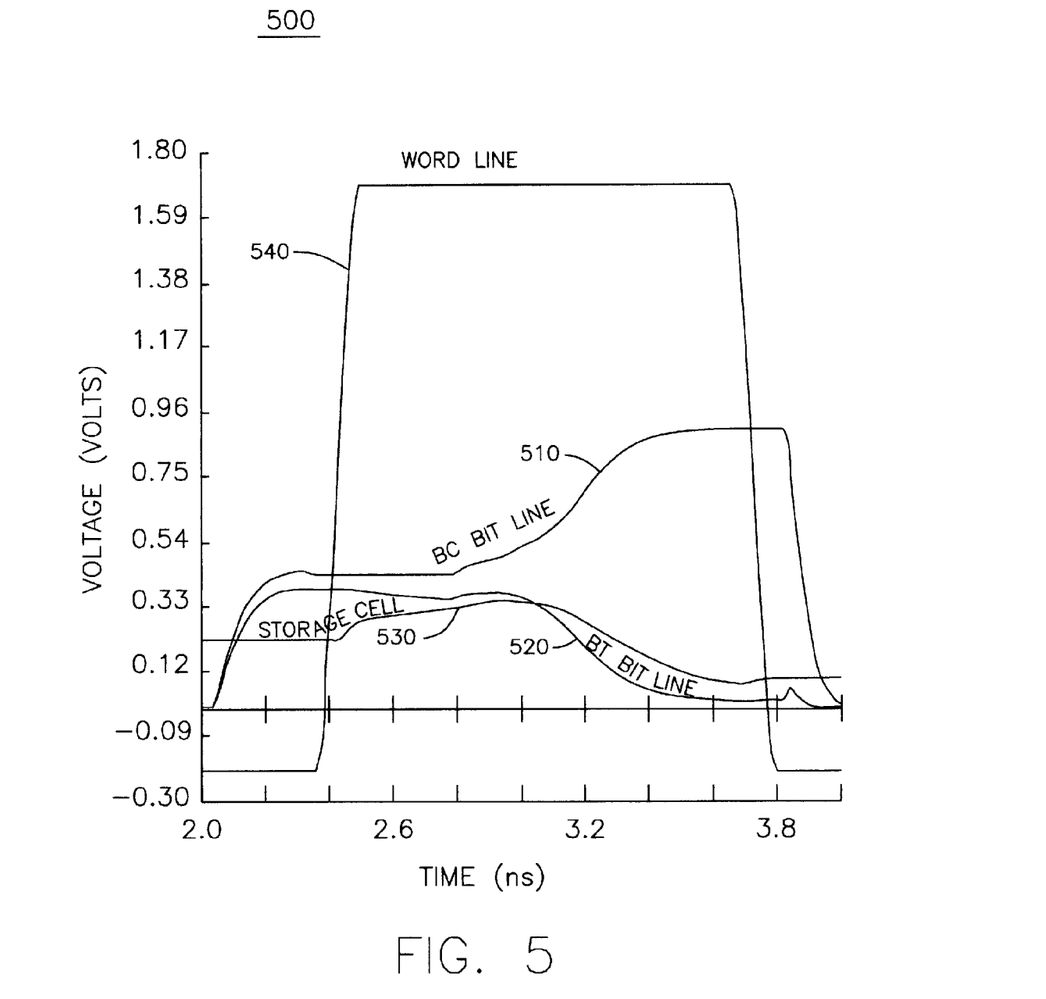
FIG. 5 shows a simulation of the operation of the sense amplifier shown in FIG. 4 according to one embodiment of the present invention.

FIG. 5 shows a simulation 500 of the operation of the sense amplifier 400 shown in FIG. 4 according to one embodiment of the present invention. In simulation 500, lines 510 and 520 represent the pre-charge time operation of bt bit line and bc bit line by the arbitrary reference level that simultaneously provides an offset for the bit lines that is used to compensate for any mismatch. Line 530 represents the voltage that is stored in storage cell 410 and line 540 represents the word line wl in the cell. As shown in FIG. 5, once the word line wl is activated charge sharing takes place between bt bit line and bc bit line and the storage cell. In this simulation, there is a charge sharing between bt bit line 520 and the voltage of the storage cell as represented by line 530. In particular, simulation 500 shows that the voltage of bt bit line decreases while the charge of the storage cell 410 increases. Because there is no charge sharing with bc bit line, its voltage level remains the same. At around time 2.8 ns the set devices (nsetp and psetn) are turned on to amplify the voltage differential between bt bit line and bc bit line. The voltages of bt bit line and bc bit line are moved in the direction that further illustrates the amplification of this voltage differential.

Figure 6:
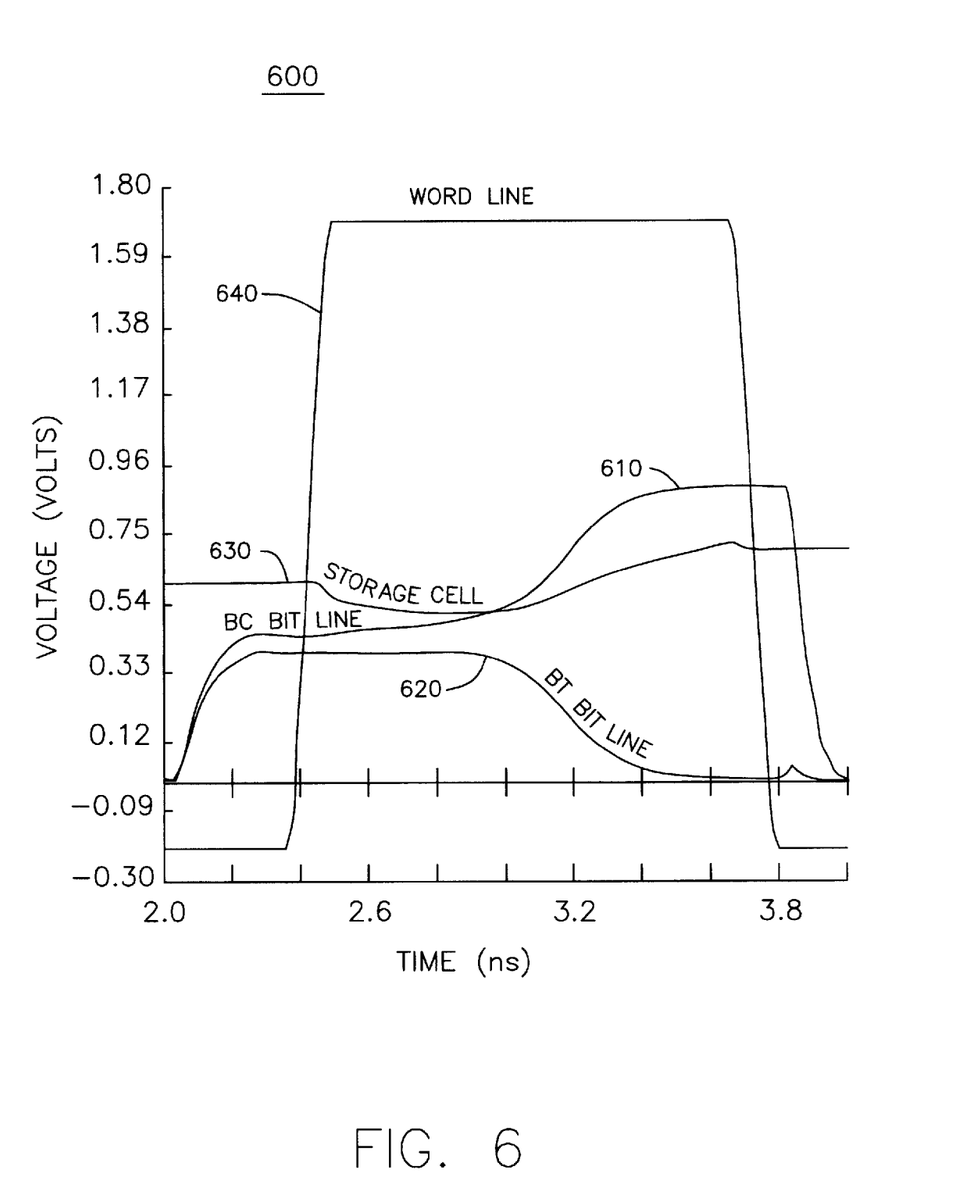
FIG. 6 shows a simulation of the operation of the sense amplifier shown in FIG. 4 as used to reliably read a high level from a storage cell in a dynamic random access memory (DRAM) array of storage cells according to one embodiment of the present invention.

FIG. 6 shows a simulation 600 of the operation of the sense amplifier shown in FIG. 4 that indicates its capability to reliably read a high level from a storage cell in a DRAM according to one embodiment of the present invention. Like simulation 500 shown in FIG. 5, simulation 600 uses like reference elements to represent like elements, except in FIG. 6 the like elements of the simulation are preceded by a "6" as opposed to a "5". In this example, the storage cell 630 has a voltage level above 600 mV. Once the word line wl is activated charge sharing takes place between bt bit line and bc bit line which are offset by an amount proportional to the mismatch. There is a charge sharing between bc bit line 610 and the voltage of the storage cell 630. Because there is no charge sharing with bc bit line its voltage level remains the same. The set devices (nset and psetn) are turned at around time 2.8 ns to amplify the voltage differential between bt bit line and bc bit line. The simulation shows the sense amplifier 400 is able to reliably read the cell voltage because there is no crossing of the bt bit line with the bc bit line and thus is able to perform suitable amplification.

It is apparent that there has been provided with this disclosure a reference level generation with offset compensation for a sense amplifier. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A circuit, comprising:
a first inverter device having an input node and an output node;
a second inverter device having an input node and an output node;
a set device including a psetn device and an nset device coupled to the first inverter device and the second inverter device, the psetn device including a pair of P-type transistors coupled together at respective gates that are configured to receive a psetn signal and the nset device including a pair of N-type transistors coupled together at respective gates that are configured to receive an nset signal, wherein the psetn device and the nset device modulate a bias level by applying a pulse to the first inverter and the second inverter, enabling each inverter to independently reach a trip point that is dependent on each specific device threshold of the inverter;
a gated shunt device configured to connect and disconnect the input node of the first inverter device to the output node of the first inverter device and the input node of the second inverter device to the output node of the second inverter device;
a cross-coupling switch configured to enable and disable a connection of the input node of the first inverter device to the output node of the second inverter device and the input node of the second inverter device to the output node of the first inverter device; and
wherein the first inverter device, second inverter device, set device, gated shunt device and cross-coupling switch are operatively coupled to perform one of a pre-charge time operation and sense time operation on a bit line having a bit line true and bit line complement connected to a storage cell from a memory device.

2. The circuit according to claim 1, wherein the gated shunt device comprises a first N-type field effect transistor (NFET) coupled to the first inverter device and a second NFET coupled to the second inverter device.

3. The circuit according to claim 1, wherein the gated shunt device generates an arbitrary mid-level voltage reference used to charge the bit line true and bit line complement while simultaneously generating an offset for the bit line true and bit line complement during the pre-charge time operation.

4. The circuit according to claim 3, wherein the offset imposes a compensation that adjusts for any device mismatch and any voltage threshold mismatch that exists between the first inverter device and the second inverter device.

5. The circuit according to claim 3, wherein the arbitrary mid-level voltage reference has a value that is between a supply voltage supplied to the first inverter device and the second inverter device and ground.

6. The circuit according to claim 1, wherein the cross-coupling switch comprises a first NFET/P-type field effect transistor (PFET) transmission gate and a second NFET/PFET transmission gate, the first NFET/PFET transmission gate and the second NFET/PFET transmission gate each having complementary enable and disable signals.

7. The circuit according to claim 1, wherein the cross-coupling switch facilitates placing parasitic capacitance on the inputs of the first inverter device and the second inverter device while enabling a connection of the input node of the first inverter device to the output node of the second inverter device and the input node of the second inverter device to the output node of the first inverter device.

8. The circuit according to claim 1, wherein the gated shunt device is gated on and the cross-coupling switch is disabled while performing the pre-charge time operation.

9. The circuit according to claim 1, wherein the gated shunt device is gated off and the cross-coupling switch is enabled while performing the sense time operation.

10. The circuit according to claim 9, wherein the sense time operation includes a signal generation time operation and an amplification time operation.

11. The circuit according to claim 1, wherein the first inverter device and the second inverter device are each configured to sense a voltage differential between the bit line true and bit line complement while performing the sense time operation.

12. The circuit according to claim 11, wherein the set device is further configured to facilitate amplification of the voltage differential during an amplification time phase operation.

13. The circuit according to claim 1, wherein the first inverter device and the second inverter device are each configured to bias a unity gain point in response to the gated shunt device connecting the input node of the first inverter device to the output node of the first inverter device and the input node of the second inverter device to the output node of the second inverter device.

14. A sense amplifier, comprising:
a first inverter device having an input node and an output node;
a second inverter device having an input node and an output node;
a set device including a psetn device and an nset device coupled to the first inverter device and the second inverter device, the psetn device including a pair of P-type transistors coupled together at respective gates that are configured to receive a psetn signal and the nset device including a pair of N-type transistors coupled together at respective gates that are configured to receive an nset signal, wherein the psetn device and the nset device modulate a bias level by applying a pulse to the first inverter and the second inverter, enabling each inverter to independently reach a trip point that is dependent on each specific device threshold of the inverter;
a gated shunt device configured to connect and disconnect the input node of the first inverter device to the output node of the first inverter device and the input node of the second inverter device to the output node of the second inverter device;
a cross-coupling switch configured to enable and disable a connection of the input node of the first inverter device to the output node of the second inverter device and the input node of the second inverter device to the output node of the first inverter device; and
wherein the first inverter device, second inverter device, set device, gated shunt device and cross-coupling switch are operatively coupled to perform one of a pre-charge time operation and sense time operation on a bit line having a bit line true and bit line complement connected to a storage cell from a dynamic random access memory (DRAM) array of storage cells, during the pre-charge time operation the gated shunt device is gated on and the cross-coupling switch is disabled, while the gated shunt device is gated off and the cross-coupling switch is enabled during the sense time operation.

15. The sense amplifier according to claim 14, wherein during the pre-charge time operation the gated shunt device generates a reference level with an offset compensation for mismatch that is used to charge the bit line true and bit line complement.

16. The sense amplifier according to claim 15, wherein the offset adjusts for any device mismatch and any voltage threshold mismatch that exists between the first inverter device and the second inverter device.

17. The sense amplifier according to claim 15, wherein the reference level is proportional to any device mismatch and any voltage threshold mismatch that exists between the first inverter device and the second inverter device.

18. The sense amplifier according to claim 14, wherein the first inverter device and the second inverter device are each configured to sense a voltage differential between the bit line true and bit line complement while performing the sense time operation.

19. The sense amplifier according to claim 18, wherein the sense time operation includes a signal generation time operation and an amplification time operation.

20. The sense amplifier according to claim 15, wherein the set device is further configured to facilitate amplification of the voltage differential during an amplification time phase operation.

21. The sense amplifier according to claim 14, wherein the cross-coupling switch facilitates placing parasitic capacitance on the inputs of the first inverter device and the second inverter device while enabling a connection of the input node of the first inverter device to the output node of the second inverter device and the input node of the second inverter device to the output node of the first inverter device.

* * * * *